United States Patent [19]
Min et al.

[11] Patent Number: 6,034,879
[45] Date of Patent: Mar. 7, 2000

[54] TWISTED LINE TECHNIQUES FOR MULTI-GIGABIT DYNAMIC RANDOM ACCESS MEMORIES

[75] Inventors: Dong-Sun Min, Austin, Tex.; Dietrich W. Langer, Pittsburgh, Pa.

[73] Assignee: University of Pittsburgh, Pittsburgh, Pa.

[21] Appl. No.: 09/026,441

[22] Filed: Feb. 19, 1998

[51] Int. Cl.$^7$ .................................................. G11C 5/06
[52] U.S. Cl. ........................................ 365/63; 365/214
[58] Field of Search ............................... 365/51, 63, 206, 365/214; 257/776, 907

[56] References Cited

U.S. PATENT DOCUMENTS

| | | | |
|---|---|---|---|
| 5,091,887 | 2/1992 | Asakura | 365/206 |
| 5,097,441 | 3/1992 | Cho et al. | 365/51 |
| 5,297,094 | 3/1994 | Rastegar | 365/214 |
| 5,475,643 | 12/1995 | Ohta | 365/51 |
| 5,534,732 | 7/1996 | Debrosse et al. | 365/63 |
| 5,586,072 | 12/1996 | Longway et al. | 365/63 |

*Primary Examiner*—Son Mai
*Attorney, Agent, or Firm*—Baker & Botts, LLP

[57] ABSTRACT

An interconnection array is provided including a plurality of line conductors having segments substantially parallel to each other in each of two or more parallel regions such that the composite length of the segments essentially matches said length of the array; the line conductors crossing in one or more crossing regions located between the parallel regions so that no line conductor remains adjacent to the same pair of neighboring line conductors in any of segments of the array; wherein adjacent line conductors in the parallel regions are spaced one pitch from each other and wherein multiple line conductors are offset up or down no more than two pitches in each of the crossing regions.

11 Claims, 10 Drawing Sheets

TWISTED LINE TECHNIQUES FOR MULTI-GIGABIT DYNAMIC RANDOM ACCESS MEMORIES

BACKGROUND OF INVENTION

Continuous advancements in the field of very large scale integrated circuits (VLSIs) and very high speed integrated circuits (VHSICs) have resulted in smaller device geometries and millions of closely spaced interconnections in one or more levels that connect the various components on the chip. Due to continued market demands for higher speed and higher density microchips, there is a widely shared conviction that the minimum structure size of mainstream CMOS devices, which is currently at about 0.4 μm corresponding to the 16-Mbit dynamic random access memory (DRAM) generation, will be scaled down to about 0.07 μm. The intense research and development (R&D) effort directed towards DRAMs, for example, has rapidly increased memory chip capacity by six orders (1-Kbit to 1-Gbit) over the last 25 years. Technologies allowing a higher density of devices were the driving force in quadrupling the memory capacity of each generation. Recently, however, R&D for 256-Mbit and 1-Gbit chips has not succeeded in continuing to sufficiently increase the density, i.e. scale down the feature size in order to keep the chip size small enough, to allow economical production with available wafer sizes.

Among the many problems to be solved in order to achieve this aggressive scaling rule is the coupling (interference) noise between the interconnections (data links) in single as well as multilevel configurations. Coupling noise is very sensitive to scaling and is considered a main obstacle to achieving reliable high speed and high density microchips. Semiconductor memories are one of the devices in which data access speed and reliable operation are dominantly determined by the degree of coupling noise. This is due to the closely spaced data lines in a memory cell array area. Also, among semiconductor memories, DRAMs are most sensitive to the adverse effect of coupling noise. Experimental 1-Gbit DRAMs have been reported with substantial scaling down schemes of memory cell arrays. As the integration density of the DRAM has increased, new types of memory cell array noise have emerged as seemingly inevitable problems. Among them is inter- and intra-bit line (BL) coupling noise due to the BL to BL coupling capacitances, which are increased as the BL pitch (separation between BLs) becomes smaller. Inter-BL coupling noise originates from capacitive coupling of signals in adjacent BL pairs. Intra-BL coupling noise is due to coupling between the two BLs which form a BL pair, i.e. true and compliment BL.

Scaling down of DRAM calls for characterization and containment of various external and internal noise sources with respect to the small amount of signal charge. Well-known bit line noises such as those from bit line to word line and substrate coupling are insensitive to scaling and can be suppressed to a low level by employing a folded bit line structure. However, in 16-Mbit DRAMs and beyond, a new kind of noise due to bit line coupling becomes important because of an increase in inter- and intra-BL capacitance.

A few studies for analyzing BL capacitance using three-dimensional simulation in scaled DRAM cell arrays report that inter-BL capacitance accounts for more than 10 percent of the total BL capacitance in 64-Mbit DRAMs. The simulated ratio of the polycide BL's coupling capacitance $C_c$) to the total BL capacitance $C_b$) as a function of BL pitch is shown in graph 100 of FIG. 1. Different BL layer thicknesses are used to simulate the exact $C_c/C_b$ ratio for each DRAM generation. For example, BL thickness of 0.18 and 0.14 μm are used for the BL pitch of 0.6 and 0.28 μm, respectively. $C_o$ is the substrate capacitance of the BL. Commercial software for interconnect parameter extraction was used for this simulation. As shown in FIG. 1, $C_c$ exceeds 30 percent of $C_b$ in 1-Gbit DRAM generation.

The inter- and intra-BL coupling noise may be minimized by proper scaling of the physical dimensions, especially thickness and width of the BL. But these schemes are limited by problems such as electromigration and the performance degradation due to the increase of the BL resistance at higher densities even with the advent of copper based interconnections.

To overcome the inter-BL coupling noise problems, a Twisted Bit Line (TBL) technique has been proposed and utilized in some DRAM chips. However, this TBL technique has two main problems: 1) an inability to suppress the intra-BL pair coupling noise, and 2) the need for additional chip area for twisting the BLs (at least four twisting areas per divided memory array) and for four dummy cells per BL pair. It thus seems that this TBL technique will not reduce the chip area sufficiently in scaled-down memory arrays to realize economic mass production of Gbit level DRAMs.

To illustrate, FIG. 2(a) shows an example of the BL configuration in the conventional TBL technique. In the conventional TBL scheme, the BLs are equally divided into four sections (or possible twisting points) A, B, C and D. A BL pair 210 is twisted at the points 'B' and 'D', and the adjacent pair 212 is twisted at the points 'A' and 'C'. This basic unit of two BL pairs is repeated over the entire memory cell array. In FIG. 2(a), the two pairs' structure is repeated once in pairs 214 and 216. WLs 218 intersect with the BLs at cells 220 such that WL 0 intersects with the true BLs (0, 1, 2, and 3) and WL 1 intersects with the complimentary BLs ($\overline{0, 1, 2,}$ and $\overline{3}$). As a result of BL twisting in this manner, the inter-BL pair coupling capacitances for adjacent and compliment BLs (BL and $\overline{BL}$) are equal for both the upper and lower sides of any BL pair. Therefore, the inter-BL pair noise cancels out, but the intra-BL pair noise still remains the same. Since the intra-BL pair noise is more detrimental than the inter-BL pair noise, in readout or sensing operations, more serious problems can be expected in applying the conventional TBL schemes to the development of the higher density DRAMs, such as 1-Gbit DRAMs and beyond. For example, the signal loss in a 1-Gbit level BL structure, where the ratio of the coupling capacitance to the total BL capacitance is 35 percent, is estimated to be more than 30 percent of the total signal amplitude, in spite of the use of the conventional TBL schemes.

In addition, the conventional TBL schemes have disadvantages with regard to chip lay-out density. The conventional TBL schemes require additional chip area for twisting BLs and also for the four dummy cells per BL pair. It is estimated that a 6.5 percent chip area increase will occur when implementing the conventional TBL schemes in a 1-Gbit DRAM. As a result, more effective techniques to reduce the BL coupling noise without incurring those penalties are necessary to realize 1-Gbit DRAMs and beyond.

U.S. Pat. No. 5,534,732 ("DeBrosse et al.") discloses a multiple twisted BL (MTBL) technique intended to address the inherent problems of the conventional TBL technique. FIG. 2(b) shows one the possible examples of this DeBrosse et al. scheme. DeBrosse et al. teaches an interconnection array layout and twist method which balances inter-pair coupling and eliminates intra-pair coupling by utilizing a single twist region 230 separating two regions 232 and 234 in which the BLs run parallel to each other. In region 232, complimentary line conductors are displaced two pitches down from corresponding true line conductors. In region 234, complimentary line conductors are displaced two pitches up from corresponding true line conductors. Each pairing of line conductors is separated by a line conductor which is different in each of the two regions 232 and 234.

In this twisting scheme, four BLs 236 are twisted once such that no true BL (BL) is immediately adjacent to its associated compliment BL ($\overline{BL}$) in both the memory arrays of before and after twisting. In addition, each BL is located and twisted such that for any given BL, capacitive coupling occurring between a given BL and immediately adjacent true BLs is balanced by capacitive coupling occurring between a given BL and immediately adjacent compliment BLs associated with the same immediately adjacent true BLs. This pattern is repeated for the length of the array as illustrated by BL group 238 and 240. As a result, the Debrosse et al. MTBL scheme eliminates both the inter- and intra-BL pair coupling noise completely. It imposes, however, serious problems in memory cell arrangement, chip area increase and BL pair capacitive and resistive imbalance. Special process and design technologies (e.g., special memory cell type, layout technique and sense amplifier design) will be necessary to implement this multiple twisted BL scheme.

Another problem of the application of the twisted scheme disclosed in DeBrosse et al. is its limitation to a specific arrangement of memory cells. This scheme cannot be applied to the folded-BL memory cell arrangement that has been adopted by most manufacturers of memory devices over the past twenty years. Proper read/write operation cannot be achieved with the folded-BL arrangement because both BLs in a BL pair (true and complement) access memory cells 242 for the same word line 244. The other problem of this twisted scheme is the requirement of dummy BLs (not shown) in both the "top" and "bottom" edges of the memory array to balance respective BL capacitances. These dummy BLs will increase the chip area considerably in addition to the BL twisting area. In addition, due to the non-symmetrical BL twisting patterns, the capacitive imbalance within BL pairs will be a serious problem for proper operation. To overcome the capacitive imbalance, this scheme will require either a special sense amplifier or a special BL layout which will consume extra chip area.

In scaled high-density DRAMs with main word line driver schemes, two characteristics of the devices create word line coupling noise which is as serious a problem as the bit line coupling noise. One characteristic is that the bootstrapped word line voltage ($V_{WL}$) has to be higher than the power supply voltage ($V_{cc}$) to compensate for the threshold voltage drop across the cell transistor. The other characteristic is the use of a metal line as a second word line to reduce the word line's RC-delay. For DRAMs with main/sub word line driver schemes, the same situation applies because, in this case, the word line control lines are metal layers with almost the same line pitch. As a result, taking account of the scaling down of the cell transistor's threshold voltage, along with the $V_{cc}$ scaling down, the word line coupling noise can be an even more serious problem than the bit line coupling noise and should be minimized in scaled high-density DRAMs.

FIG. 6 shows one of the worst case data patterns for word line coupling noise. FIG. 6(a) shows a BL pair 602 intersecting with four WLs (i, j, k and 1) before connecting to a sense amplifier 604. In the first active cycle, shown in FIG. 6(b), memory cell j having data '0' is selected and, simultaneously, word line k, which is adjacent to the selected word line j, is disturbed by the word line coupling voltage ($V_{cp}$). Then, by this $V_{cp}$ generated at the word line k, the unselected memory cell k having data '0' is disturbed by the memory cell disturbance voltage ($V_{cd}$) in the half-$V_{cc}$ bit line precharge scheme. If the disturbed cell k, is selected for the next cycle, then $V_{cp}$ generated at the word line j and memory cell j is also disturbed by $V_{cd}$, thereby increasing the noise/signal ratio dramatically. The combined amount of noise caused by both the word line and bit line coupling would be intolerable for proper DRAM operations, particularly for high-speed, low-power DRAMs.

An object of the present invention is to provide a twisting technique which can be applied to both BLs and WLs to reduce coupling noise without incurring other problems such as increased chip area and the need for special circuitry.

SUMMARY OF THE INVENTION

The present invention provides new multiple twisted data line techniques which reduce both the inter- and intra-BL coupling noises and overcome the excessive chip area penalty imposed by the conventional TBL techniques and the DeBrosse et al. technique. The twisting methods according to the present invention are not limited to bit lines in DRAMs, but can also be extended to word lines in DRAMs or to any integrated circuit device employing data and/or address buses.

An advantage of the present invention is that it results in a reduction of the noise/signal ratio in signal channels in any device where a large number of charge or data transmitting lines run closely spaced in parallel and where, therefore, crosstalk or interference occurs. Bit and word lines in memory arrays, in particular in DRAMs, are prime examples, e.g., experimental evidence for a 1-Gbit DRAM indicate a 45 percent decrease in the noise/signal ratio in bit lines. Another advantage is that the present invention results in a two thirds reduction of the additional chip area which is needed for the presently favored technique for the reduction of intra-bit line noise (the conventional TBL). Furthermore, the method of twisting BLs according to the present invention is not limited to trench type memory cells, but is also applicable to folded BL memory cells.

In the design of memory chips, the smaller noise/signal ratio in BLs and, in particular, the reduction of intra-BL noise (which the conventional TBL technique does not accomplish) allows several favorable design options. First, the BLs can be spaced closer, thereby decreasing the needed chip area. Second, the signal charge originating from the cell capacitor can be reduced by using a smaller area capacitor, by reducing the charging voltage or by using a less complicated process for fabricating the cell capacitor. A corresponding reduction in chip area or operating power would desirably result. Finally, a stronger (less noisy) signal at the sense amplifier can also be translated into a higher access speed. Apart from the utilization of the Multiple Twisted Bit Line (MTBL) technique in bit lines, Multiple Twisted Word Line (MTWL) or word line control signal lines offer similar advantages. This technique offers closer spacing, i.e. less chip area and/or the potential of using a lower voltage for the turn-on of the cell transistor.

Each of these features, or a combination of them (whichever one wants to select), combined with the reduction of area in comparison with conventional twisting methods, manifests a very distinct advantage in the design of memory arrays of higher density. In the design of higher capacity memories (1-Gbit and more), the premium is put on higher density and low power because, with wafer sizes no longer drastically increasing, the astronomical costs of new designs and fabrication lines can only be amortized if the increase in chip size remains to be a small fraction of the increase in memory capacity. Only in this way can the cost per bit continue to decrease, thereby providing the driving force for larger memories.

BRIEF DESCRIPTION OF THE DRAWINGS

Further objects, features and advantages of the invention will become apparent from the following detailed description taken in conjunction with the accompanying figures in which.

Figure 1:
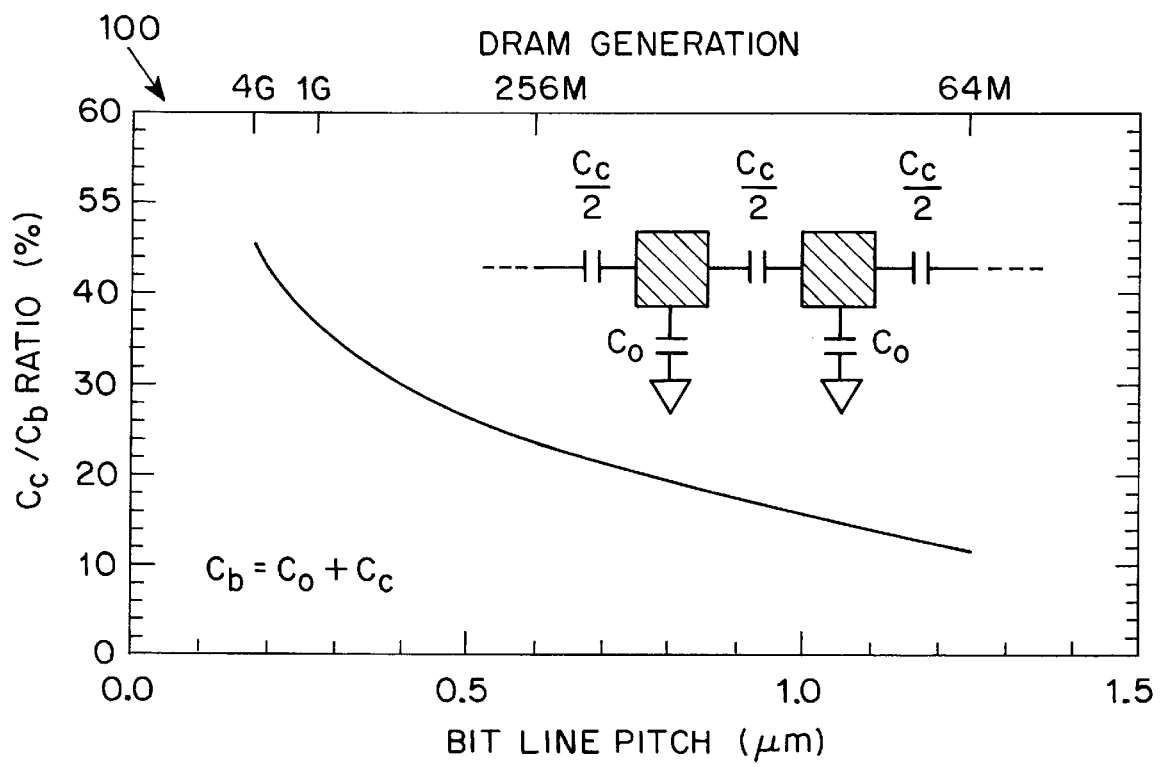
FIG. 1 is a graph of a simulated ratio of the polycide bit lines coupling capacitance to the total bit line capacitance as a function of bit line pitch in a DRAM cell array.

Throughout the figures, the same reference numerals and characters, unless otherwise stated, are used to denote like features, elements, components or portions of the illustrated embodiment. Moreover, while the subject invention will now be described in detail with reference to the figures, it is done so in connection with preferred embodiments. It is intended that changes and modifications can be made to the described embodiments without departing from the true scope and spirit of the subject invention as defined by the appended claims.

DETAILED DESCRIPTION

According to the present invention, an interconnection array of line conductors are disposed substantially parallel to each other and normally one pitch width apart from each other. The total length of the line conductors (or array) is segmented into N segments where N is greater than one. Between the segments, line conductors are twisted in N-1 crossing regions so that the line conductors are displaced one or two pitches "up" or "down" from segment to segment.

Figure 3A:
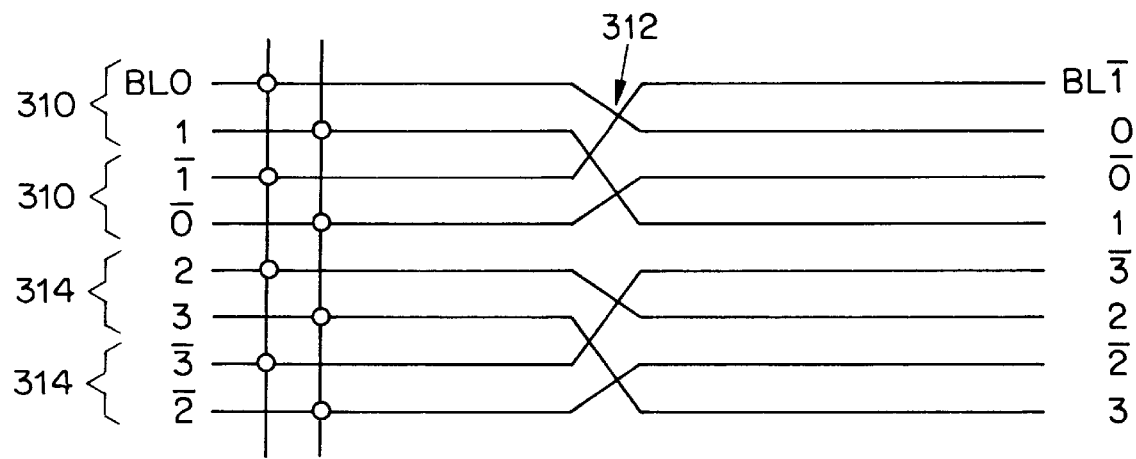
FIGS. 3(a), 3(b) and 3(c) are diagrams showing MTBL techniques in accordance with the present invention.

FIG. 3(a) illustrates one of the MTBL structures according to the present invention. In this MTBL structure, two adjacent BL pairs 310 are twisted just once with each other at the crossing region 312 of the BLs. This twisting pattern is repeated in pairs 314. To reduce both the inter- and intra-BL pair noise, at least two BL pairs are twisted so that outside BLs (e.g., 0 and $\overline{0}$) are twisted into inside BLs and inside BLs (e.g., 1 and $\overline{1}$) are twisted into outside BLs, or vice versa. In other words, from right to left in FIG. 3(a), a first BL is offset two pitches "down," a second BL is offset one pitch "up," a third BL is offset one pitch "down" and a fourth BL is offset two pitches "up" or vice versa. Every BL pair is twisted with one neighboring pair. With respect to each BL pair, both the inter-BL pair noise from the adjacent BLs and the intra-BL pair noise from the same BL pair itself are equally shared by half with each adjacent BL and compensated in the differential sensing scheme. This situation is the same for other adjacent BL pairs. Therefore, in the MTBL scheme of the present invention, both the inter- and intra-BL pair noise are converted to common mode noise and half of it is canceled out in the sensing operation. This noise reduction mechanism remains effective in any BL precharge voltage scheme.

Figure 2A:
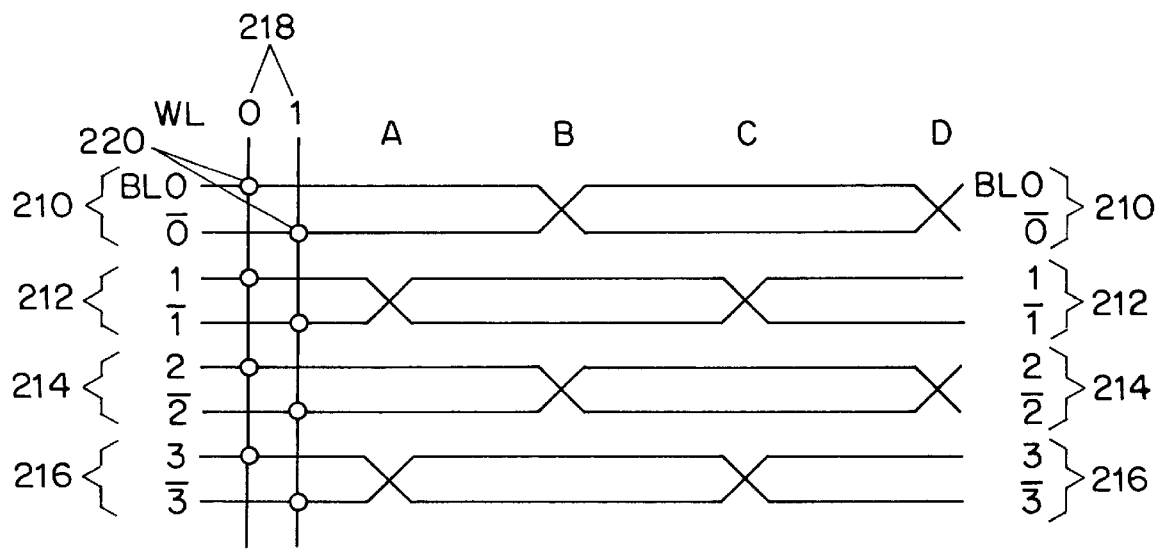
FIG. 2(a) is a diagram showing a conventional TBL technique of the prior art.
Figure 2B:
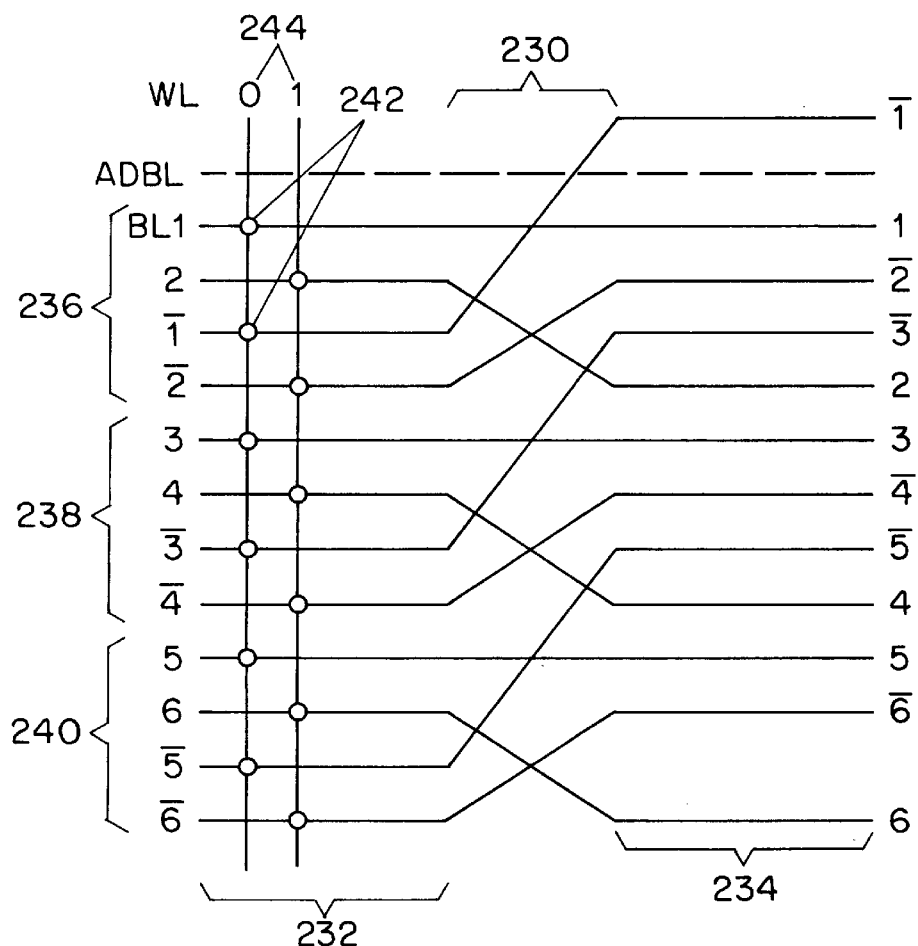
FIG. 2(b) is a diagram showing a conventional MTBL technique of the prior art.

Compared to folded and untwisted BL structures, intra-bit line noise originating from coupling between adjacent true and compliment BLs of the same BL pair is thus reduced by 50 percent. Inter-bit line noise originating from coupling between adjacent BLs of different BL pairs is also reduced by 50 percent. With regard to the reduction of the chip area, in the embodiment illustrated in FIG. 3(a), the single twisting area, while wider than one conventional single BL pair twist, accommodates the dummy cell. In the conventional TBL scheme, as illustrated in FIG. 2(a), each of the four twisting areas must be stretched wide enough to accommodate a dummy cell. Thus, the scheme of the present invention reduces the chip area required for twisting by about two-thirds. In addition, since every two BLs composing a single BL pair have exactly the same twisting pattern, the technique of the present invention does not require any special layout and/or sense amplifier design as is the case in DeBrosse et al. The benefits of the MTBL schemes of the present invention are also valid for other memory cell arrangement patterns (e.g., open- or folded-BL pair).

Figure 3B:
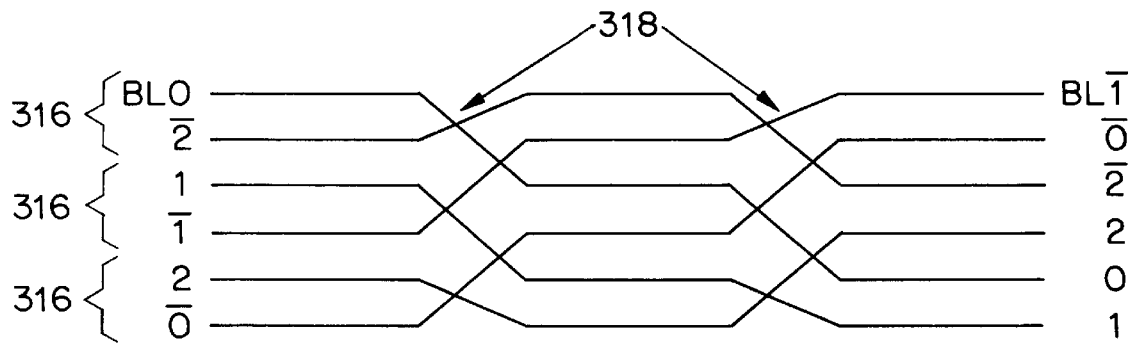
Figure 3C:
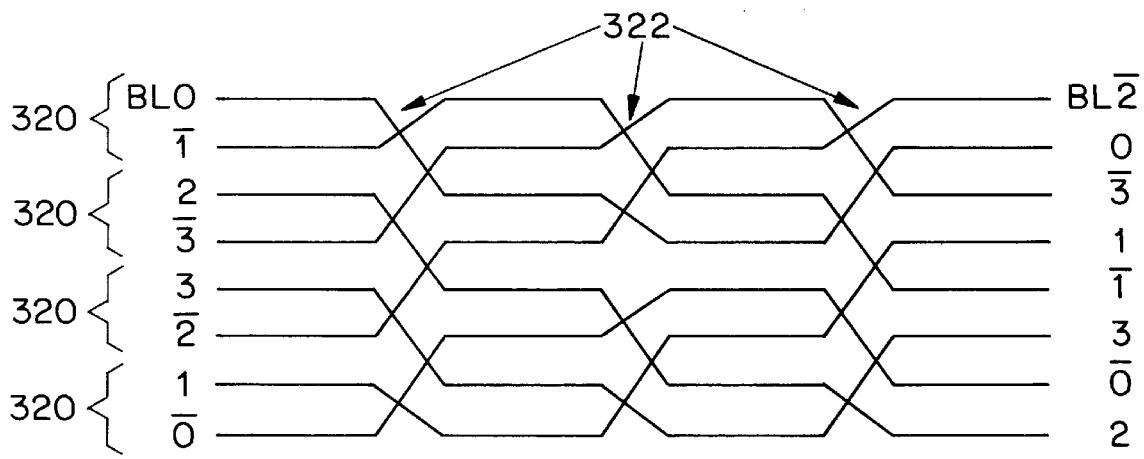

Further BL noise reduction is possible by utilizing twisting sets of six BLs (or three pairs 316), as shown in FIG. 3(b). In the embodiment of FIG. 3(b), two crossing regions 318 are required. The twisting scheme is adjusted accordingly. In the embodiment of FIG. 3(c), twisting sets of eight BLs (or four pairs 320) are utilized. Here, three crossing regions 322 are required.

These twisting methods, as shown in FIGS. 3(b) and 3(c), reduce both the inter-BL and intra-BL noise by approximately 66 percent and 75 percent, respectively. While reducing the chip area savings in comparison to the embodiment of FIG. 3(a), the symmetry in twisting is maintained and thus no special sense amplifiers are required. An evaluation of the two BL pairs twisting method shown in FIG. 3(a) bear the following results.

In order to evaluate the MTBL technique of the present invention, test chips with different BL pitches were designed and fabricated utilizing both the conventional TBL and the MTBL techniques. Each test chip was comprised of a 64-Mbit memory array with stacked capacitor memory cells.

BLs are made of polycide and another layer of polycide was used for the crossing portion in the BL twisted area. BL layer thickness was also changed according to the BL pitch to implement the exact ratio of the coupling capacitance to the total BL capacitance for each DRAM generation. For example, BL layer thickness of 0.18 μm (256-Mbit DRAM) and 0.14 μm (1-Gbit DRAM) were used for the BL pair pitch of 0.6 and 0.28 μm, respectively.

A detailed lay-out study revealed that it takes about 1.5 and 2.1 μm for each BL twisted portion for the conventional TBL technique and the MTBL technique according to the present invention in the 1-Gbit DRAMs, respectively. The total chip area increment is 2.3 percent for the MTBL in the 1-Gbit DRAMs, in contrast to the 6.5 percent needed for the realization of the conventional TBL. The incremental chip area in the MTBL is smaller due to the reduced number of BL pair twisting compared to the conventional TBL.

The BL mode soft-error rate test was used for measurement of the noise/signal ratio, because it reflects the operating margin in signal readout/sensing operations most sensitively. Also, HSPICE was used for the simulation of the noise/signal ratio. Model parameters for CMOS 256-Mbit DRAMs transistors were used.

Although the embodiments shown in FIGS. 3(*a*)–(*c*) implement, at most, two pitch crossings of line conductors, those skilled in the art will understand that the line conductors could be offset by more than two pitches between adjacent regions.

Figure 4:
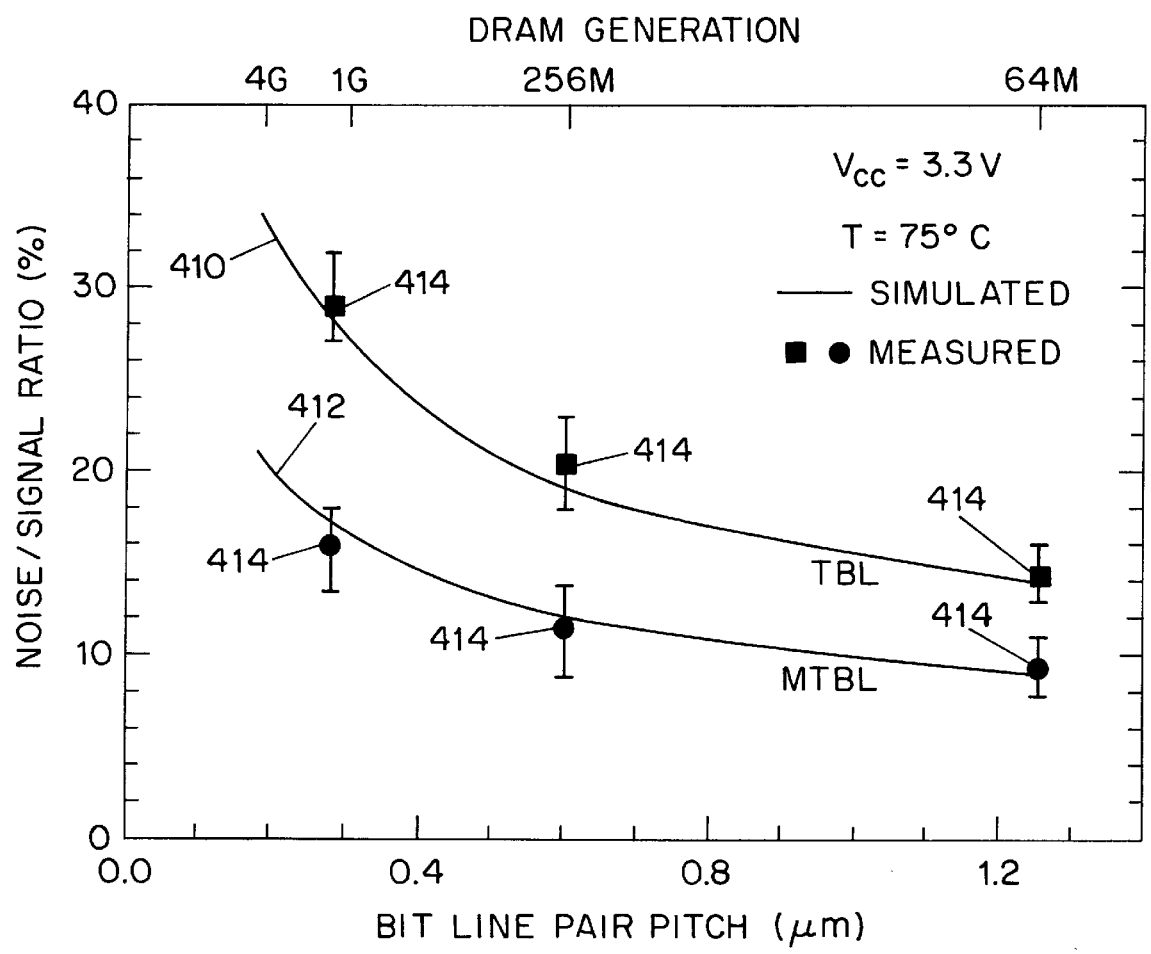
FIG. 4 is a graph showing the measured and simulated noise/signal ratio of the conventional TBL technique and the MTBL technique according to the present invention.

FIG. 4 shows measured and simulated noise/signal ratio as a function of BL pair pitch. The simulated curves 410 and 412 represent a fit through the values computed for 64-Mbit, 256-Mbit and 1-Gbit DRAMs for the TBL and MTBL technique, respectively. Measured values 414 show the estimated uncertainties of the experimental results. The horizontal axes show the BL pair pitch and DRAM generation corresponding to each BL pair pitch. Since $C_c/C_b$ ratio becomes larger as the BL pair pitch becomes narrower, the noise/signal ratio increases dramatically in both the conventional TBL and the MTBL schemes of the present invention as the BL pair pitch is scaled down. For example, in the case of 0.28 μm BL pair pitch, which corresponds to a 1-Gbit DRAM, the noise/signal ratio is 29 percent for the conventional TBL scheme. Taking into account the portion of the noise/signal ratio that is generated by different memory array sources, such as word line coupling noise and substrate coupling noise, this ratio is unacceptable for the reliable operation of the 1-Gbit DRAMs and beyond. The noise/signal ratio, however, can be reduced to 16 percent by utilizing the present MTBL scheme, thus achieving a 45 percent reduction of the noise/signal ratio as compared to the conventional TBL scheme. This improvement in the noise/signal ratio is attributed to the reduction of intra-BL pair noise in the MTBL technique. The improvement in noise/signal ratio is proportional to the scaling of BL pair pitch. As a result, more reduction in the noise/signal ratio for even higher density DRAMs can be expected by utilizing the MTBL scheme of the present invention. In addition to the improved noise/signal ratio, faster access times in DRAM operation also can be expected by adopting the MTBL scheme.

Figure 5:
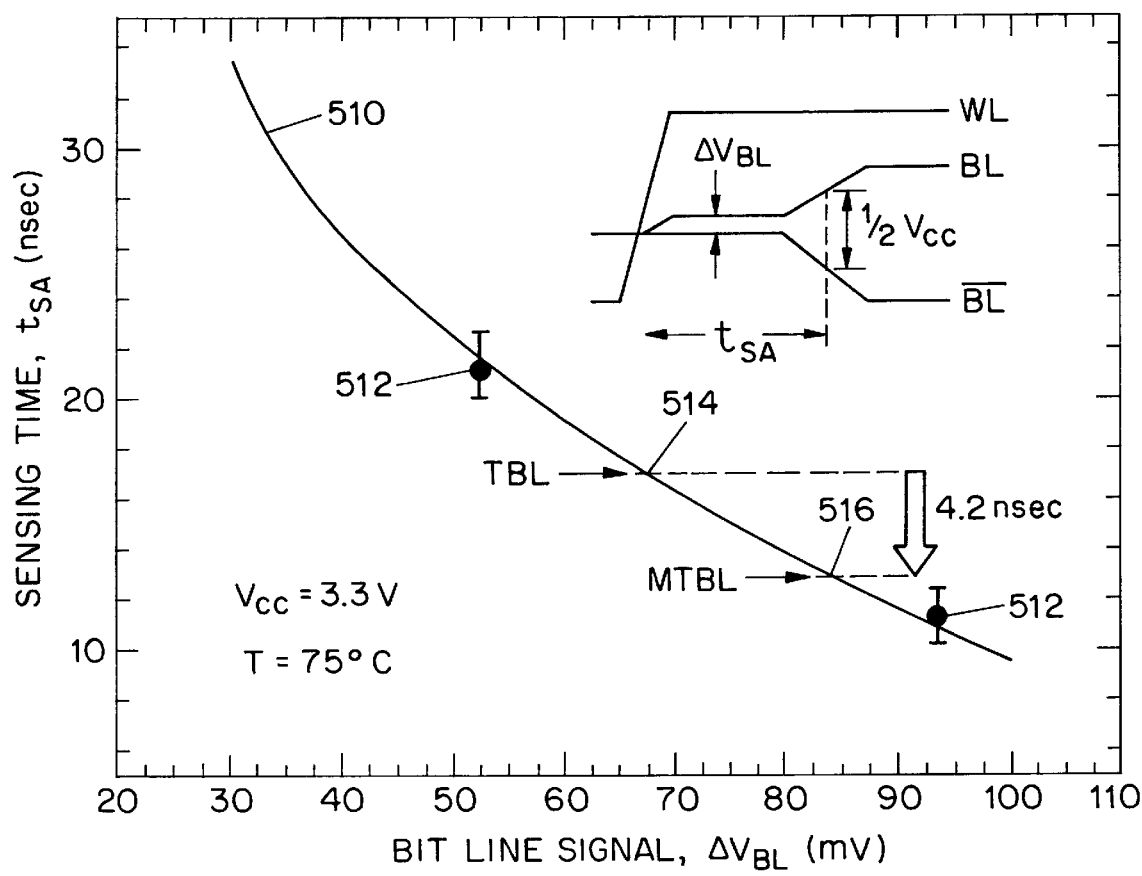
FIG. 5 is a graph showing the measured and simulated sensing time as a function of bit line signal margin for the conventional TBL technique and the MTBL technique according to the present invention.
Figure 6A:
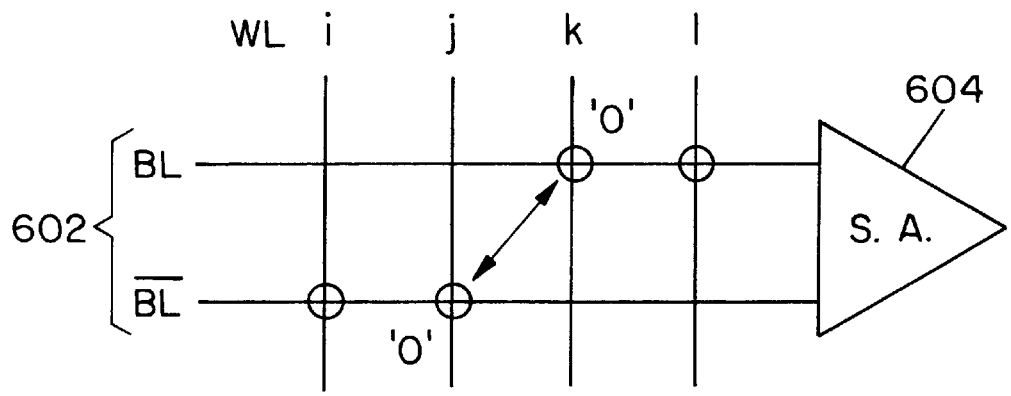
FIGS. 6(a) and 6(b) are diagrams showing one of the worst case data patterns for WL coupling noise in DRAMs.
Figure 6B:
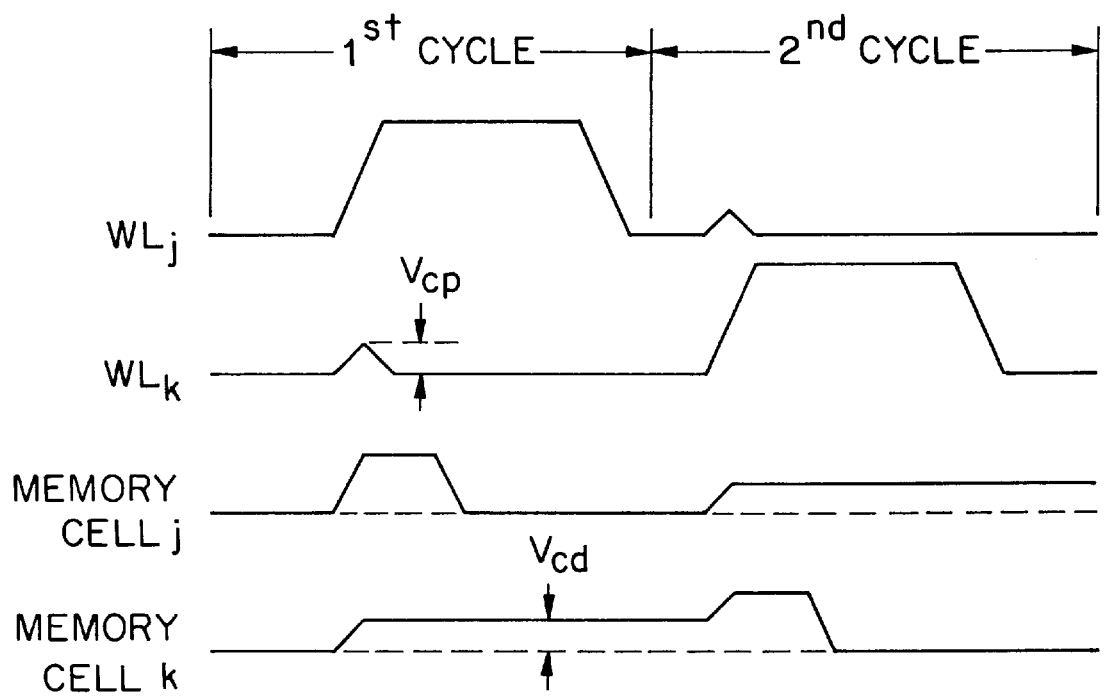

Since the speed of a sense amplifier is proportional to the amount of the BL signal, faster access time for smaller noise/signal ratio results. FIG. 5 shows the simulated 510 and measured 512 sensing time ($t_{SA}$) as a function of bit line signal margin ($\Delta V_{BL}$). As shown in FIG. 5, the data access time can be reduced by 4.2 nsec by replacing the expected value according to the conventional TBL technique 514 with that according to the MTBL scheme 516 of the present invention in the 1-Gbit DRAM generation. This access time reduction corresponds to an 8.4 percent improvement for typical DRAMs with 50 nsec access times.

Figure 7:
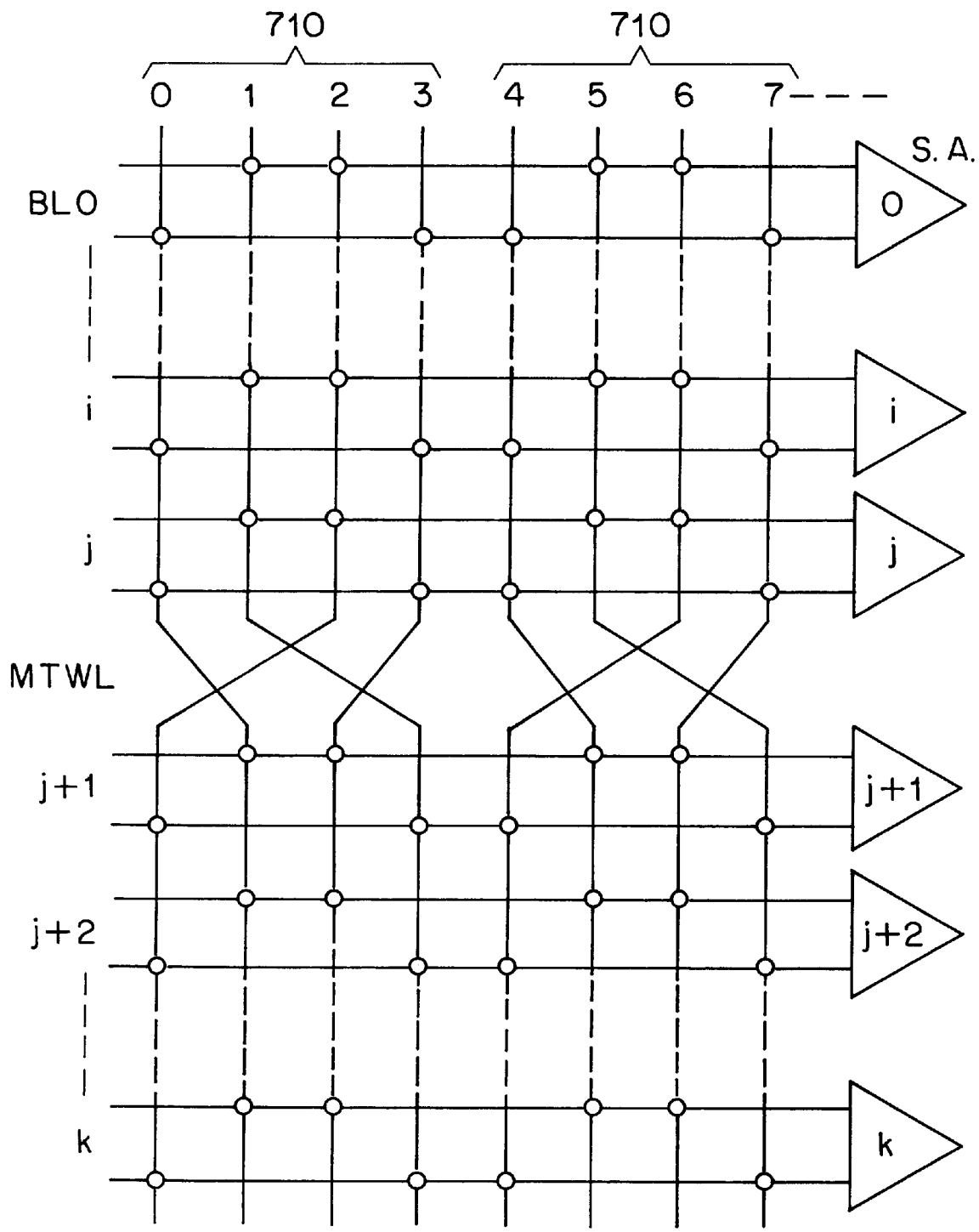
FIG. 7 is a diagram showing an embodiment of the Multiple Twisted Word Line technique according to the present invention.

The present invention also provides a word line (WL) architecture based on the multiple twisted data line technique to reduce word line coupling noise. This Multiple Twisted Word Line (MTWL) scheme analogous to the MTBL scheme in FIG. 3(*a*) is shown in FIG. 7. In the MTWL scheme of FIG. 7, four neighboring WLs 710 are twisted with each other at the center of the WLs to reduce the effective coupling capacitance of adjacent WLs. The same method of twisting, as described hereinabove for BLs, is used. All adjacent WLs spaced with one WL pitch are separated by at least two WL pitches after twisting. Since the effective coupling capacitance is inversely proportional to the spacing distance, considerable effective coupling capacitance reduction can be expected by utilizing the MTWL scheme. It should be mentioned that the conventional TBL, scheme cannot be applied to WL structures for WL coupling noise reduction because only one WL can be selected for a given divided sub memory array in any read/write cycle. Furthermore, the multiple twisting scheme disclosed in DeBrosse et al., if applied to WLs, would result in the same amount of WL coupling noise reduction as the MTWL scheme of the present invention achieves. However, the DeBrosse et al. technique would impose a chip area penalty as discussed hereinabove.

Since WLs are twisted at a given strapping (shunt) area in the present MTWL scheme, the chip area increase for this technique can be minimized for DRAMs with a main WL driver scheme (where WLs are comprised of polysilicon MOS gate and metal layer). For DRAMs with a main/sub WL scheme (where WLs and WL control lines are comprised of polycide MOS gate layer and metal layer, respectively), there is no chip area penalty for the present MTWL scheme. As a result, it is more desirable to utilize MTWL schemes such as six WLs with double twisting or six WLs with triple twisting (analogous to FIGS. 3(*b*) and 3(*c*)) than to utilize a MTWL scheme of four WLs with single twisting to further reduce WL coupling noise. Hereinbelow, the MTWL scheme of four WLs with single twisting with a main WL driver scheme (FIG. 7) is used for the simulation and measurement of the MTWL technique according to the present invention.

To evaluate the MTWL technique of the present invention, test chips with different WL pitches were designed and fabricated utilizing both the conventional WL (non-twisted) and the proposed MTWL schemes. 256-Mbit DRAM test chips similar to those used for the BL coupling noise measurements were modified for this purpose. Two WL layers of polycide and metal are used for the crossing portion in the WL twisted area. In addition, the metal WL layer thickness was also changed according to the WL pitch in order to evaluate WL coupling noise accurately for each DRAM generation. For example, metal WL layer thicknesses of 0.7 μm and 0.5 μm were used for the WL pitch of 0.56 μm 256 Mbit DRAM) and 0.25 μm (1-Gbit DRAM), respectively. The thickness of the polycide WL layer remained constant for the convenience of the test chip fabrication. However, the inaccuracy caused by the constant polycide thickness on the WL coupling noise measurement would be minor because the metal WLs contribute the major portion of the WL coupling capacitance.

Since the MTWL scheme of the present invention is applied to DRAM test chips with a main WL driver scheme, the twisted WL area can be placed into a given WL shunt area to minimize the chip area penalty. A detailed layout study revealed that the incremental chip area in the present MTWL is as small as 0.2 percent of the total 256-Mbit test chip size compared to the conventional WL scheme.

Figure 8:
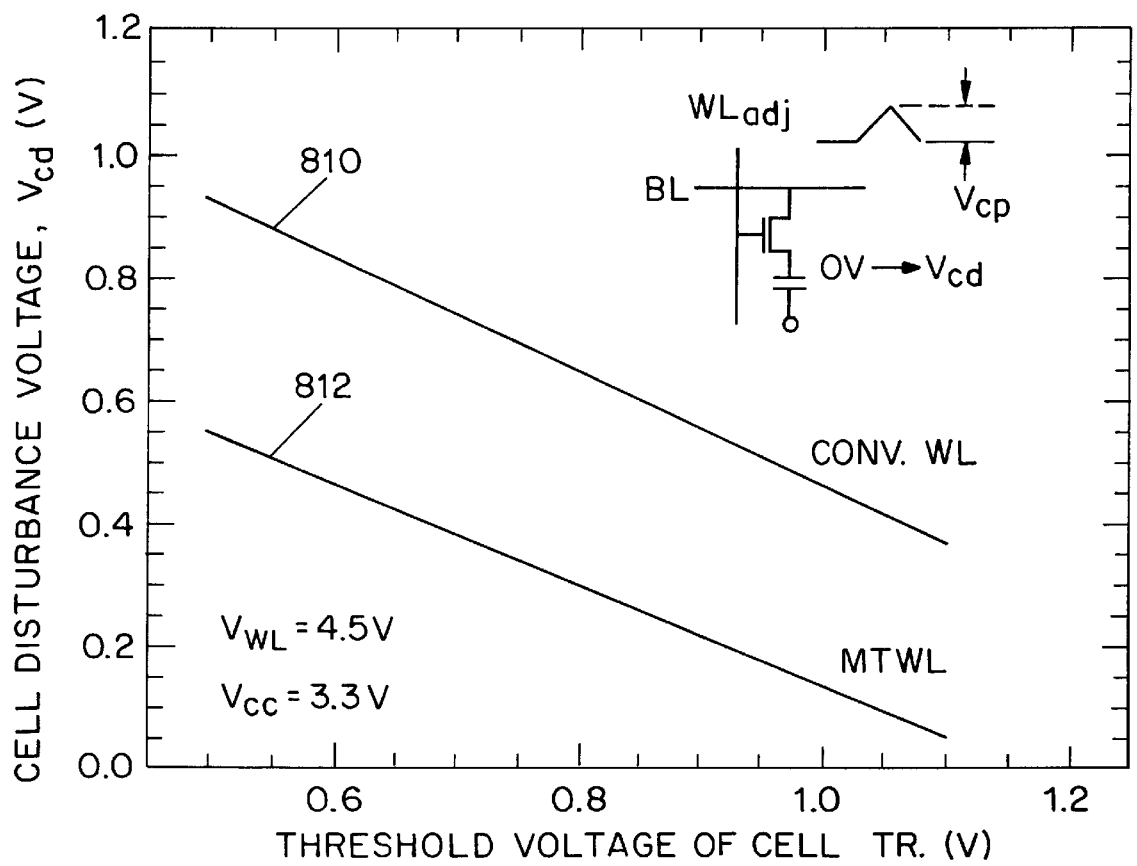
FIG. 8 is a graph showing a simulated cell disturbance voltage as a function of the threshold voltage of the cell for the conventional WL technique and the MTWL technique according to the present invention.

FIG. 8 shows the simulated cell disturbance voltage ($V_{cd}$) of the conventional WL 810 and present MTWL 812 schemes versus the memory cell transistor's threshold voltage $V_{th}$. WL pitch is assumed to be 0.56 μm which corresponds to a 256-Mbit DRAM generation. By utilizing the present MTWL technique, $V_{cd}$ can be reduced by 54 percent for a $V_{th}$ of 1.0 V as compared to the conventional WL scheme. As shown in FIG. 8, a higher $V_{th}$ can be used as an alternative technique to reduce WL coupling noise. The utilization of a higher $V_{th}$ is, however, limited by need for scaling down $V_{cc}$ for scaled DRAMs.

Figure 9:
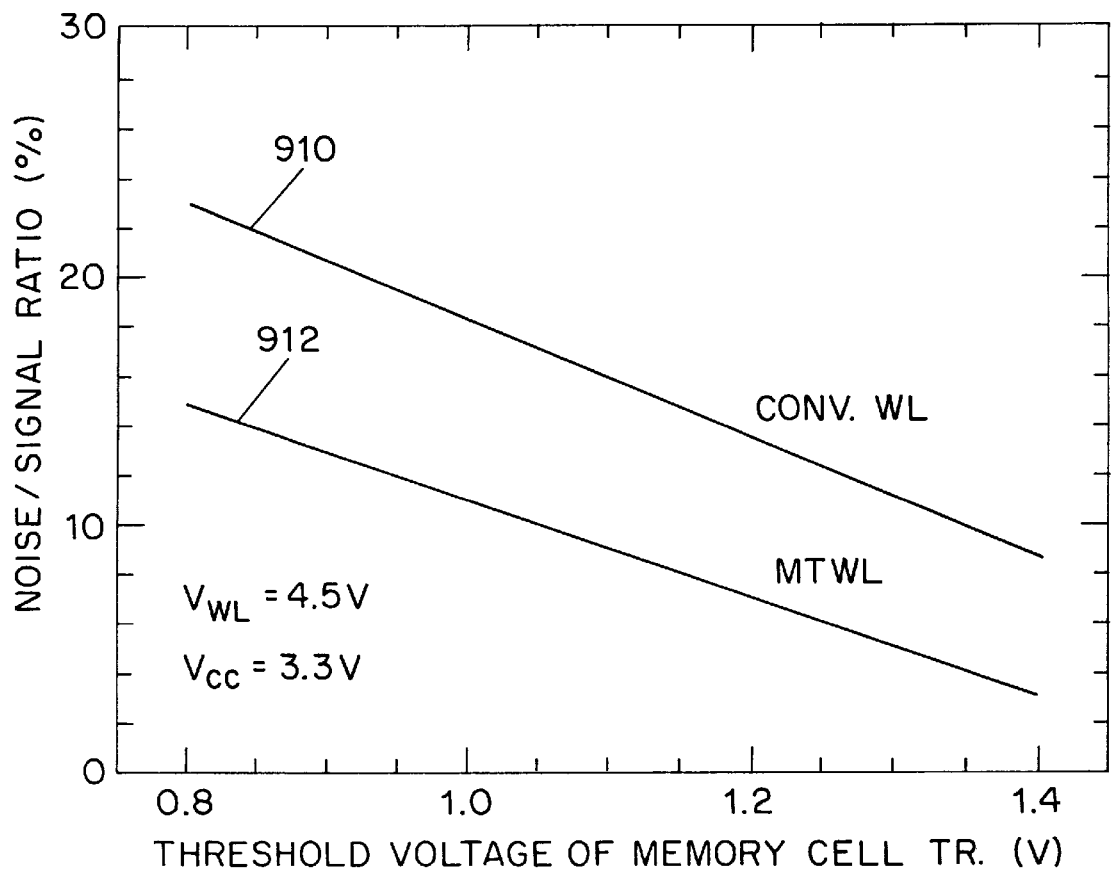
FIG. 9 is a graph showing simulated noise/signal ratio as a function of the threshold voltage of the cell for the conventional WL technique and the MTWL technique according to the present invention.

FIG. 9 shows the simulated noise/signal ratio of the conventional WL 910 and present MTWL 912 schemes versus $V_{th}$ for a WL pitch of 0.56 μm. For the conventional WL scheme with $V_{th}$ of 1.0 V, the noise/signal is 18 percent in the worst case data pattern. For the present MTWL scheme, however, the noise/signal ratio can be reduced to 12 percent achieving a 33 percent reduction of the noise/signal ratio as compared to the conventional WL scheme. The achievable gain of signal margin could be traded for a smaller WL pitch and/or a reduction of the $V_{th}$.

Figure 10:
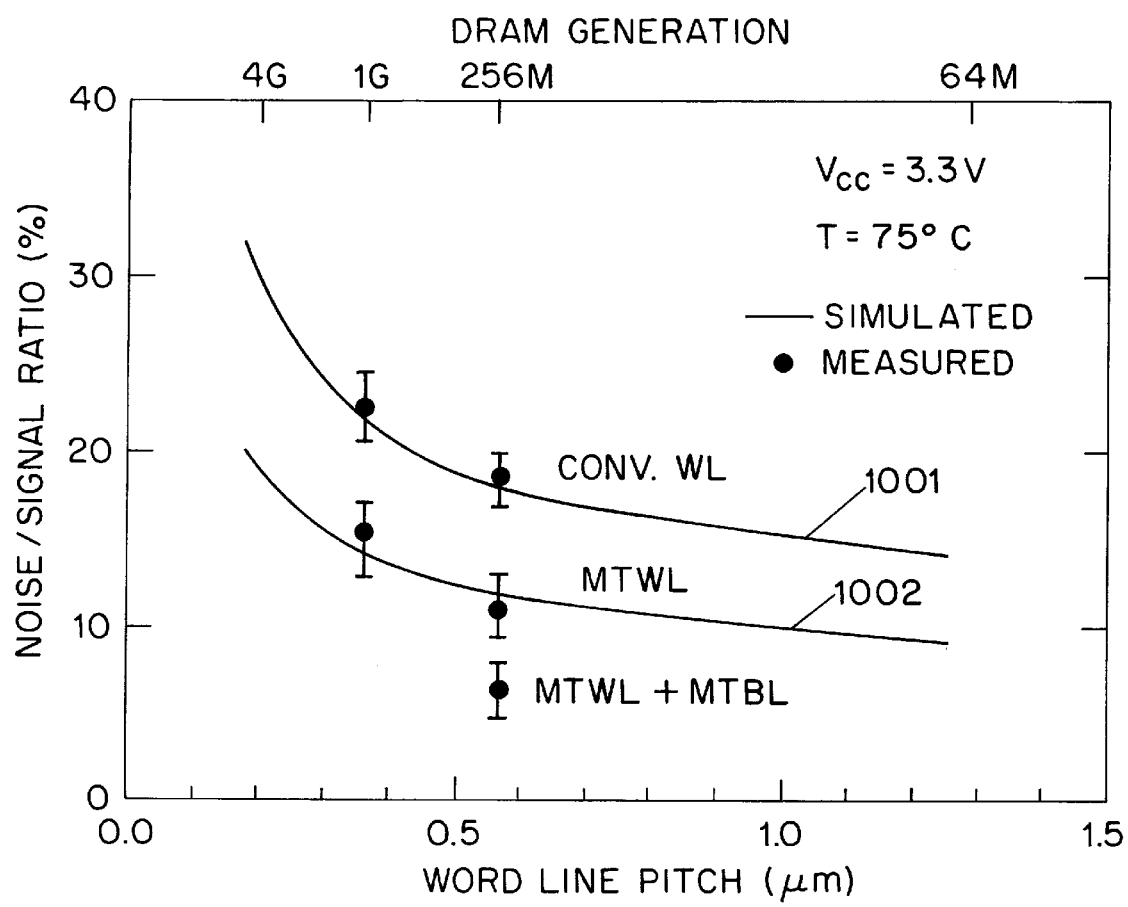
FIG. 10 is a graph showing measured and simulated noise/signal ratio as a function of word line pitch for the conventional WL technique and the MTWL technique according to the present invention.

FIG. 10 shows measured and simulated noise/signal ratios of the conventional WL 1001 and present MTWL 1002 schemes versus WL pitch with $V_{th}$ of 1.0 V. In addition, measured noise/signal ratio of the present MTWL combined with the MTBL scheme of the present invention is also shown for the 256-Mbit DRAM generation. The same soft-error rate test used for the BL coupling noise measurement is utilized for this purpose. The uncertainty in the noise/signal ratio measurement is caused by the WL pitch's deviation during photolithographic and etching processes and by the fluctuation of $V_{th}$. The noise/signal ratio increases drastically in all the WL schemes as the WL pitch is scaled down. For example, in the case 0.37 μm WL pitch which corresponds to 1-GBit DRAM generation, the noise/signal ratio is 23 percent for the conventional WL scheme. In combination with BL coupling noise, this amount of noise/signal ratio caused by WL coupling is unacceptable. This noise/signal ratio, however, can be reduced to 15 percent using the MTWL scheme of the present invention, thus achieving a 35 percent reduction of the noise/signal ratio as compared to the conventional WL scheme. When the present MTWL technique is applied together with the present MTBL technique, an even higher reduction of the noise/signal ratio can be expected. For example, for a 256-Mbit DRAM, the noise/signal ratio can be reduced by 38 percent with implementation of the present MTWL scheme as compared to the conventional WL scheme. When both MTWL and MTBL schemes of the present invention were implemented, a 64 percent reduction was achieved compared to the conventional WL/TBL implementation.

In summary, novel multiple twisted data line techniques of the present invention overcome the coupling noise problem in high-density, high speed semiconductor memories. As examples, their effectiveness in reducing both the bit line and word line noise in the gigabit level DRAM's were evaluated by soft-error rate measurements and circuit simulations. With the utilization of the present MTBL technique in a 1-Gbit DRAM, one can expect a 45 percent reduction of bit line coupling noise as compared to the conventional TBL scheme. Also, the chip area increase necessitated by the conventional TBL can be reduced by two thirds. In addition, with the present MTBL technique, the data access time is projected to be 4.2 nsec faster, which corresponds to a 8.4 percent improvement for typical DRAMs which have access time of 50 nsec. For the word line application, a 35 percent reduction of the noise/signal can be achieved with the application of the present MTWL scheme to a 1-Gbit DRAM. Further improved noise/signal ratio with the application of both the MTWL and MTBL schemes is also confirmed by measurements. Finally, a faster data access time can be expected when both MTWL and MTBL schemes are incorporated together into DRAMs.

Although the present invention has been described in detail, it should be understood that various changes, substitutions and alterations can be made hereto without departing from the spirit and scope of the invention as defined by the appended claims. For example, the applications of the new twisting methods of the present invention are not limited to bit lines and word lines in DRAMs, but can also be extended to any integrated circuit device employing date and/or address buses.

What is claimed is:

1. An interconnection array having a length, said interconnection array comprising:

a plurality of line conductors having segments substantially parallel to each other in each of two or more parallel regions such that a composite length of the segments essentially matches said length of the array;

said plurality of line conductors crossing in one or more crossing regions located between said parallel regions so that no line conductor remains adjacent to the same pair of neighboring line conductors in any of said segments of said array;

wherein adjacent line conductors in said parallel regions are spaced one pitch from each other; and wherein multiple line conductors are offset up or down no more than two pitches in each of said crossing regions.

2. The interconnection array of claim 1 wherein said plurality of line conductors comprises at least one set of four line conductors.

3. The interconnection array of claim 1 wherein said plurality of line conductors comprises at least one set of six line conductors.

4. The interconnection array of claim 1 wherein said plurality of line conductors comprises at least one set of eight line conductors.

5. The interconnection array of claim 1 wherein said plurality of line conductors comprises paired line conductors having a true line conductor and an associated compliment line conductor.

6. The interconnection array of claim 5 wherein each true line conductor and associated compliment line conductor are spaced an odd number of pitches apart in each of said segments.

7. The interconnection array of claim 1 wherein said plurality of line conductors comprises bit lines.

8. The interconnection array of claim 1 wherein said plurality of line conductors comprises word lines.

9. The interconnection array of claim 2 wherein each set of four line conductors comprises:

a first line conductor;

a second line conductor disposed below and adjacent said first line conductor in a first parallel region;

a third line conductor disposed below and adjacent said second line conductor in said first parallel region; and a fourth line conductor disposed below and adjacent said third line conductor in said first parallel region;

wherein said first line conductor is offset one pitch down in a second parallel region, said second line conductor is offset two pitches down in said second parallel region, said third line conductor is offset two pitches up in said second parallel region, and said fourth line conductor is offset one pitch up in said second parallel region.

10. The interconnection array of claim 3 wherein each set of six line conductors comprises:

a first line conductor;

a second line conductor disposed below and adjacent said first line conductor in a first parallel region;

a third line conductor disposed below and adjacent said second line conductor in said first parallel region;

a fourth line conductor disposed below and adjacent said third line conductor in said first parallel region;

a fifth line conductor disposed below and adjacent said fourth line conductor in said first parallel region; and a sixth line conductor disposed below and adjacent said fifth line conduct in said first parallel region;

wherein said first line conductor is offset two pitches down in a second parallel region and an additional two pitches down in a third parallel region, said second line conductor is offset one pitch up in said second parallel region and two pitches down from said second parallel region in said third parallel region, said third line conductor is offset two pitches down in said second parallel region and an additional one pitch down in said third parallel region, said fourth line conductor is offset two pitches up in said second parallel region and an additional one pitch up in said third parallel region, said fifth line conductor is offset one pitch down in said second parallel region and two pitches up from said second parallel region in said third parallel region, and said sixth line conductor is offset two pitches up in said second parallel region and an additional two pitches up in said third parallel region.

11. The interconnection array of claim 4 wherein each set of eight line conductors comprises:

a first line conductor;

a second line conductor disposed below and adjacent said first line conductor in a first parallel region;

a third line conductor disposed below and adjacent said second line conductor in said first parallel region;

a fourth line conductor disposed below and adjacent said third line conductor in said first parallel region;

a fifth line conductor disposed below and adjacent said fourth line conductor in said first parallel region;

a sixth line conductor disposed below and adjacent said fifth line conductor in said first parallel region;

a seventh line conductor disposed below and adjacent said sixth line conductor in said first parallel region; and a eighth line conductor disposed below and adjacent said seventh line conductor in said first parallel region;

wherein said first line conductor is offset two pitches down in a second parallel region, an additional one pitch down in a third parallel region, and two pitches up from said third parallel region in a fourth parallel region;

said second line conductor is offset one pitch up in said second parallel region, two pitches down from said second parallel region in said third parallel region, and an additional two pitches down in said fourth parallel region;

said third line conductor is offset two pitches down in said second parallel region, an additional two pitches down in said third parallel region, and an additional one pitch down in said fourth parallel region;

said fourth line conductor is offset two pitches up in said second parallel region, an additional one pitch up in said third parallel region, and two pitches down from said third parallel region in said fourth parallel region;

said fifth line conductor is offset two pitches down in said second parallel region, an additional one pitch up in said third parallel region and two pitches up from said third parallel region in said fourth parallel region;

said sixth line conductor is offset two pitches up in said second parallel region, an additional two pitches up in said third parallel region, and an additional one pitch up in said fourth parallel region;

said seventh line conductor is offset one pitch down in said second parallel region, two pitches up from said second parallel region in said third parallel region, and an additional two pitches up in said fourth parallel region; and said eighth line conductor is offset two pitches up in said second parallel region, an additional one pitch up in said third parallel region and two pitches down from said third parallel region in said fourth parallel region.

* * * * *

UNITED STATES PATENT AND TRADEMARK OFFICE
CERTIFICATE OF CORRECTION

PATENT NO. : 6,034,879

DATED : March 7, 2000

INVENTOR(S) : Min et al.

It is certified that error appears in the above-identified patent and that said Letters Patent is hereby corrected as shown below:

In the Claims:
Column 10, line 48: "compliment" should read -- complement --;
Column 10, line 51: "compliment" should read -- complement --;

In the Specification:

Column 1, line 50: "compliment" should read -- complement --;

Column 1, line 65: "$C_c$)" should read -- ($C_c$) --;

Column 1, line 66: "$C_b$)" should read -- ($C_b$) --;

Column 2, line 35: "complimentary" should read -- complementary --;

Column 2, line 38: "pliment" should read -- plement --;

Column 3, line 3: "complimentary" should read -- complementary --;

Column 3, line 5: "complimentary" should read -- complementary --;

Column 3, line 10: "compliment" should read -- complement --;

Column 3, line 15: "compliment" should read -- complement --;

Column 6, line 29: "compliment" should read -- complement --;

UNITED STATES PATENT AND TRADEMARK OFFICE
CERTIFICATE OF CORRECTION

PATENT : 6,034,879
DATED : March 7, 2000
INVENTOR(S) : Min et al.

It is certified that error appears in the above-identified patent and that said Letters Patent is hereby corrected as shown below:

Column 7, line 8: "0.6" should read -- 0.6 --;

Column 8, line 5: "50" should read -- 50 --;

Column 9, line 61: "DRAM's" should read -- DRAMs --;

Signed and Sealed this

Fifteenth Day of May, 2001

Attest:

NICHOLAS P. GODICI

Attesting Officer

Acting Director of the United States Patent and Trademark Office